United States Patent [19]

Hasegawa et al.

[11] Patent Number: 4,934,044
[45] Date of Patent: Jun. 19, 1990

[54] WIRING METHOD AND APPARATUS FOR ELECTRONIC CIRCUIT BOARDS OR THE LIKE

[75] Inventors: Hiroshi Hasegawa, Kanagawa; Toshiyuki Amimoto, Yokohama; Mitsukiyo Tani, Odawara, all of Japan

[73] Assignee: Hitachi, Ltd., Tokyo, Japan

[21] Appl. No.: 283,376

[22] Filed: Dec. 12, 1988

[30] Foreign Application Priority Data

Dec. 11, 1987 [JP] Japan .................. 62-312235

[51] Int. Cl.⁵ .................. B21F 1/00; B25B 3/00; B25B 27/00
[52] U.S. Cl. .................. 29/850; 29/853; 29/854; 156/196; 156/199; 228/173.5; 269/217
[58] Field of Search .................. 29/745, 846, 850, 853, 29/854; 140/105; 156/196, 199; 228/179, 173.5, 4.5; 269/217, 218, 234, 900

[56] References Cited

U.S. PATENT DOCUMENTS

| | | | |
|---|---|---|---|
| 2,995,357 | 8/1961 | Dennis et al. | 269/218 |
| 3,608,190 | 9/1971 | Steranko et al. | 29/850 |
| 4,627,162 | 9/1986 | Holt | 29/850 |
| 4,724,612 | 2/1988 | Pearson | 29/850 |

FOREIGN PATENT DOCUMENTS

| | | |
|---|---|---|
| 0021894 | 1/1981 | European Pat. Off. . |
| 2590105 | 5/1987 | France . |
| 53-145061 | 12/1978 | Japan . |
| 55-166991 | 12/1980 | Japan . |
| 58-16186 | 4/1983 | Japan . |
| 59-124793 | 7/1984 | Japan . |
| 8601070 | 2/1986 | PCT Int'l Appl. . |

Primary Examiner—Michael W. Ball
Assistant Examiner—Gregory J. Wilber
Attorney, Agent, or Firm—Kenyon & Kenyon

[57] ABSTRACT

A method for wiring an electronic device including a plurality of electronic components and a plurality of connector elements for interconnecting the plurality of electronic components, the connector elements being arranged on the same plane in spaced relation to each other so as to define passages includes a number of steps. A first discrete line is connected to a surface of a first connector element such that the first discrete line extends on a first passage extending along the first connector element. Two pins are positioned along the first passage, substantially perpendicular thereto. The first discrete line is bent along the two pins, a distance between the at least two pins is then reduced, and the at least two pins are then moved away from the first passage. Similar, steps can be used to provide multiple discrete line between two connector elements or along the same passage between different connector elements.

10 Claims, 7 Drawing Sheets

WIRING METHOD AND APPARATUS FOR ELECTRONIC CIRCUIT BOARDS OR THE LIKE

BACKGROUND OF THE INVENTION

The present invention relates to a wiring method for an electronic circuit board or the like having mounted thereto electronic components at high density, and to a wiring apparatus for carrying the method into practice and, more particularly, to a wiring method and a wiring apparatus for discrete wires interconnecting the electronic components.

In recent years, electronic components such as LSI and the like have been mounted, at extremely high density, on an electronic circuit board, particularly, on a board associated with a computer. This has extremely increased the number of lines interconnecting the electronic components. Further, diversification of user's needs have resulted in deficiency or insufficiency of the lines within the board, so that the necessity has been raised to additionally arrange discrete lines on the board. Moreover, discrete lines are newly arranged on the board when measures are taken for a defect in design, a defect in production and the like, because it is difficult to change and modify the wiring within the board.

There have been proposed various methods of fixing discrete lines to a board, which include (A) a fixing method due to tape adhesive (cf. Japanese Patent Unexamined Publication No. 55-166991), (B) a method of fixing discrete lines by bringing the same into engagement with guide pins, guide posts or the like mounted to the board (cf. Japanese Utility Model Examined Publication No. 58-16186 and Japanese Patent Unexamined Publication No. 53-145061), and (C) a method of fixing discrete lines by pushing the same aside (cf. Japanese Patent Unexamined Publication No. 59-124793).

The above fixing method (A) has the following problems. That is, in case where high-density mounting of electronic components proceeds, so that the arranging density of connector pads, to which the discrete lines are connected, is further raised, a space for application of a tape between the connector pads is reduced extremely, making it difficult to wire the discrete lines. Furthermore, the adhesive coating flows onto other connector pads to cover the same, making it impossible to connect discrete lines to the other connector pads.

The above fixing method (B) can adjust the form of the wiring as a whole by twining the discrete lines about guide pins. However, the method (B) has the following problem. That is, it is difficult from the viewpoint of a space to mount the guide pins to the entire locations where the discrete lines extend from the respective connector pads, so that the discrete lines cover the surface of the respective other connector pads. As a result, it is difficult to connect the discrete lines to the other connector pads.

The above fixing method (C) is disadvantageous in that when the discrete lines to be wired are large in number, or when the discrete lines are fine, pushing-aside of the discrete lines mars or severs the same.

SUMMARY OF THE INVENTION

It is an object of the present invention to provide a discrete-line wiring method and a wiring apparatus for carrying the method into practice, suitable for an electronic device having mounted thereto electronic components at high density, in which a plurality of discrete lines can be connected to the same connector element, without the necessity of increasing an area of the connector element and an area of a passage for permitting the discrete lines to pass and without interference with connection of a discrete line to another connector element.

According to the invention, there is provided a wiring method for an electronic device including a plurality of electronic components and a plurality of connector elements for interconnecting the plurality of electronic components, the connector elements being arranged on the same plane in spaced relation to each other so as to define, between the connector elements, passages for permitting discrete lines to pass, the wiring method comprising the steps of connecting a first discrete line to a surface of a first connector element such that the first discrete line extends on a first passage extending along the first connector element, positioning at least two pins along the first passage substantially normal thereto, bending and deforming the first discrete line along the pins, and reducing a distance between the pins, and moving the pins away from the first passage.

The wiring method according to the invention may further comprise the steps of connecting a second discrete line to a surface of a second connector element located along the first passage, such that the second discrete line extends on the first passage, positioning the at least two pins along the first discrete line substantially normal to the first passage, bending and deforming the second discrete line along the pins positioned along the first discrete line, to superimpose the second discrete line upon the first discrete line, and reducing the distance between the pins positioned along the first discrete line, and moving the pins away from the first passage, thereby wiring the second discrete line to the second connector element.

Moreover, the wiring method according to the invention may further comprise the step of adhesively bonding the superimposed first and second discrete lines to each other.

According to the present invention, there is also provided a discrete-line wiring apparatus for an electronic device including a plurality of electronic components and a plurality of connector elements for interconnecting the plurality of electronic components, the connector elements being arranged on the same plane in spaced relation to each other so as to define, between the connector elements, passages for permitting discrete lines to pass, the apparatus comprising a pair of pin holders supported for angular movement toward and away from each other, at least one upstanding pin mounted to a lower surface of a forward end of one of the pair of pin holders, a single upstanding pin mounted to a lower surface of a forward end of the other pin holder, means for angularly moving the pair of pin holders, and means for adjusting an opening degree between the forward ends of the respective pin holders.

Preferably, the sum of the upstanding pins mounted to the lower surfaces of the respective pin holders is equal to that of the connector elements arranged along a passage along which the discrete line extends, and spacings between adjacent pins is equal to those between adjacent connector elements arranged along the passage along which the discrete line extends.

DESCRIPTION OF THE PREFERRED EMBODIMENTS

Figure 1:
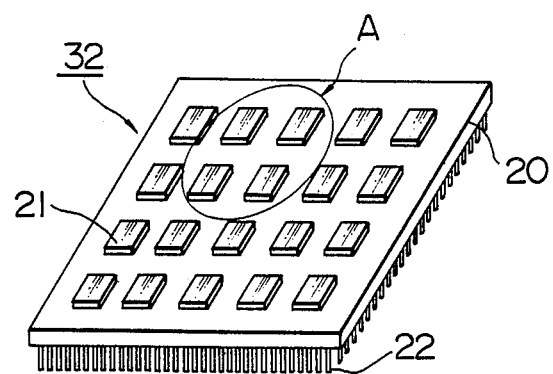
FIG. 1 is a perspective view of a multichip package to which a wiring method according to the present invention is applied.
Figure 2:
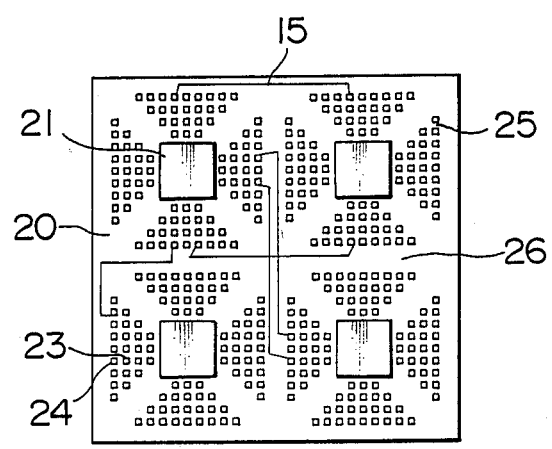
FIG. 2 is an enlarged plan view of a portion encircled by A in FIG. 1.

A wiring method and a wiring apparatus according to the present invention will be described, taking as an example a so-called "multichip package" shown in FIGS. 1 and 2 in which a plurality of semiconductor chips are mounted to a multilayer ceramic board. As shown in FIGS. 1 and 2, a multichip package 32 has a multilayer ceramic board 20 and a plurality of semiconductor chips 21 mounted to the board 20. A plurality of connector pads 23 and 24 for connection of discrete lines 15 are printed on the surface of the board 20 as shown in FIG. 2. The connector pads 23 and 24 are so arranged as to define therebetween passages 25 and 26 for permitting the discrete lines 15 to pass for interconnecting the connector pads or for connecting the connector pads to other electronic instruments.

Figure 3:
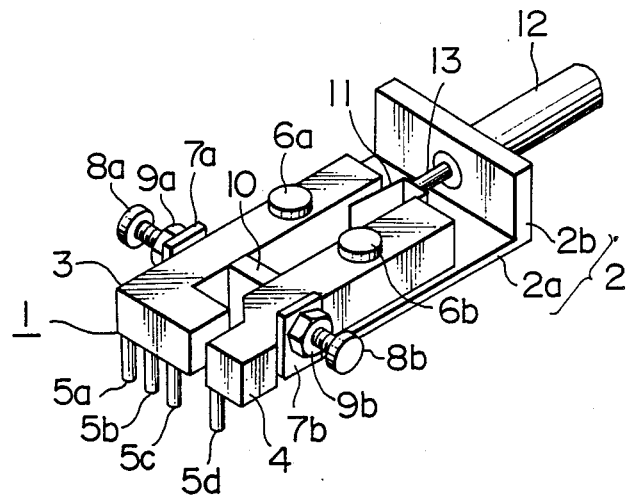
FIG. 3 is a perspective view of an embodiment of a wiring apparatus according to the present invention.
Figure 4:
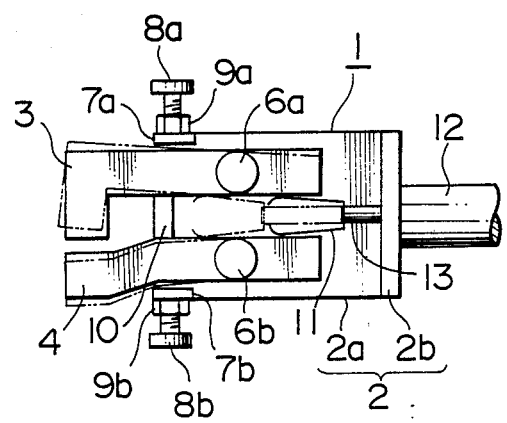
FIG. 4 is a top plan view of the wiring apparatus illustrated in FIG. 3, FIGS. 5A through 5C are partially cross-sectional diagrammatic side elevational views for explanation of a method of connecting a discrete line to a connector pad.

As shown in FIG. 3, a wiring apparatus 1 has an L-shaped base member 2. The base member 2 has a planar section 2a to which first and second pin holders 3 and 4 are mounted in spaced relation to each other for angular movement about respective headed pivots 6a and 6b. At least one upstanding pin is mounted to a lower surface of the forward end of the first pin holder 3, while a single upstanding pin 5d is mounted to a lower surface of the forward end of the second pin holder 4. In the illustrated embodiment, the sum of the pins are made equal to that of the connector pads 23 and 24 along the passages 25, and spacings between adjacent pins is also made equal to that between adjacent connector pads 23 and 24. That is, in the illustrated embodiment, three pins 5a, 5b and 5c are mounted to the first pin holder 3 in a single row, and a single pin 5d is mounted to the second pin holder 4. The spacings between adjacent pins is made equal to that between adjacent connector pads 23 and 24 along the passages 25. A positioning block 10 is mounted to the forward end of the planar section 2a of the base member 2, for limiting an inward angular position of the first and second pin holders 3 and 4 indicated by the solid lines in FIG. 4, that is, a closed position. Two positioning pins 8a and 8b are mounted also to the forward end of the planar section 2a of the base member 2, for limiting an outward angular position of the first and second pin holders 3 and 4 indicated by the broken lines in FIG. 4, that is, an open position. The positioning pins 8a and 8b are formed respectively by male-threaded elements. The positioning pins 8a and 8b are threadedly engaged respectively with threaded bores extending respectively through a pair of ear sections 7a and 7b which project upwardly respectively from opposite sides of the base member 2. When the positioning pins 8a and 8b are turned about their respective axes, the positioning pins 8a and 8b are adjusted in their respective threaded-engaging positions, thereby making it possible to adjust the open position of the first and second pin holders 3 and 4. The reference numerals 9a and 9b denote locknuts for fixing the longitudinal threaded-engaging positions of the respective positioning pins 8a and 8b. A hydraulic cylinder 12 extends through a vertical section 2b of the base member 2 normal to the planar section 2a and is fixedly mounted to the vertical section 2b. The hydraulic cylinder 12 has a rod 13 which extends between the first and second pin holders 3 and 4 for movement therealong forwardly and rearwardly. A leaf spring 11 is mounted to the forward end of the rod 13. The leaf spring 11 is slidable along the first and second pin holders 3 and 4 to apply biasing force thereto. The arrangement is such that when the rod 13 is moved rearwardly, the first and second pin holders 3 and 4 are angularly moved inwardly toward the closed position, while when the rod 13 is moved forwardly, the first and second pin holders 3 and 4 are angularly moved outwardly toward the open position.

A discrete-line wiring method employing the above wiring apparatus will be described with reference to FIGS. 5A and 5B and FIGS. 6A through 6F.

Figure 5A:
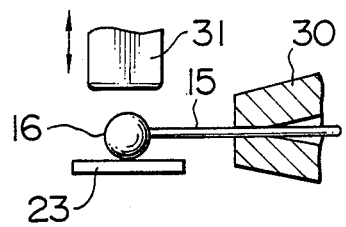
Figure 5B:
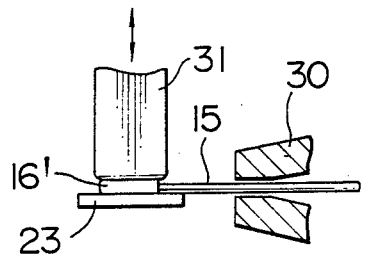
Figure 6A:
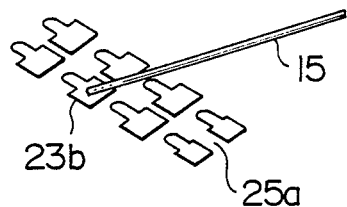
FIGS. 6A through 6F are diagrammatic views for explanation of the wiring method according to the present invention.

The discrete line 15 is connected to a connector pad 23b and extended on a passage 25a which extends along the connector pads 23b (FIG. 6A). The connection is carried out in the following manner. That is, as shown in FIG. 5A, the discrete line 15 is supplied from a capillary 30 to the connector pad 23b horizontally so that a solder ball 16 formed at the forward end of the discrete line 15 is positioned on the connector pad 23b. Subsequently, a bonding head 31 is moved substantially vertically downwardly to heat and press the solder ball 16. Thus, as shown in FIG. 5B, the solder ball 16 is deformed into a disc-shape 16' and is connected to the connector pad 23b.

Figure 6B:
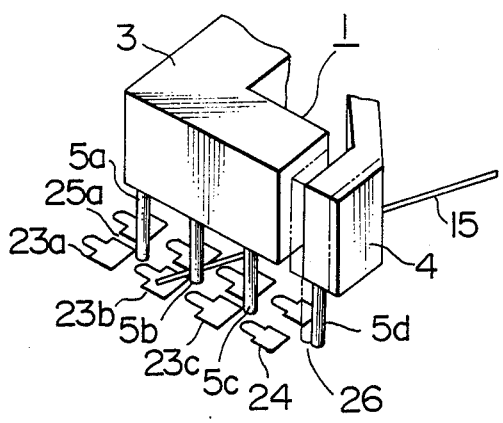
Figure 6C:
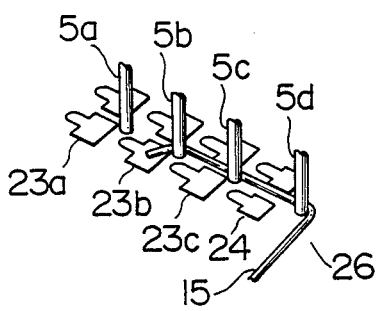
Figure 6D:
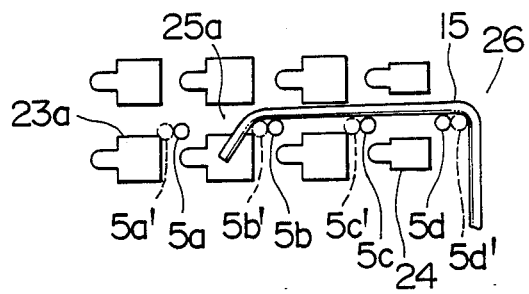

Subsequently, the wiring apparatus 1 is so positioned that the pins 5a, 5b, 5c and 5d are located along the passage 25a substantially vertically thereto (FIG. 6B). At this time, the first and second pin holders 3 and 4 of the wiring apparatus 1 are set to the open position. That is, the rod 13 of the hydraulic cylinder 12 is moved forwardly to angularly move the first and second pin holders 3 and 4 to the open position under the biasing force of the leaf spring 11. Then, as shown in FIG. 6C, the discrete line 15 is bent and deformed along the pins 5b and 5d so that the discrete line 15 extends on and along the passage 26. Subsequently, the rod 13 of the hydraulic cylinder 12 is moved rearwardly to angularly move the first and second pin holders 3 and 4 to the closed position indicated by the solid lines in FIG. 6D, thereby reducing the distance between the pins. The wiring apparatus 1 is then moved away from the passage 25a.

Figure 6E:
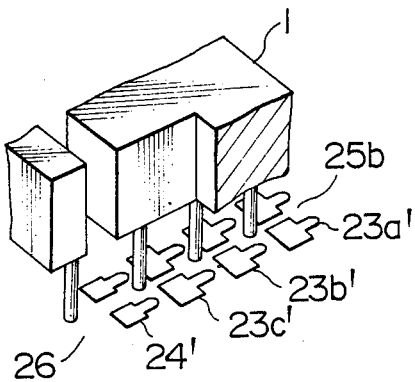
Figure 6F:
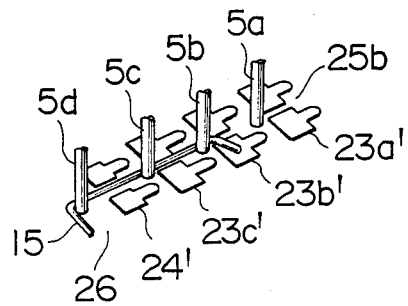

When the discrete line 15 connected to the connector pad 23b is connected to another connector pad 23b', the above-described steps are executed inversely. That is, the wiring apparatus 1 in which the first and second pin holders 3 and 4 are held at the open position is so positioned that the pins 5a, 5b, 5c and 5d are located along another passage 25b substantially vertically thereto (FIG. 6E). The discrete line 15 is then bent and deformed along the pins 5b and 5d so that the discrete line 15 extends on the connector pad 23b'. Subsequently, the rod 13 of the hydraulic cylinder 12 is moved rearwardly to angularly move the first and second pin holders 3 and 4 to the closed position indicated by the solid lines in FIG. 6D, thereby reducing the distance between the pins. The wiring apparatus 1 is then moved away from the passage 25a. The solder ball 16 at the forward end of the discrete line 15 is heated and pressure-bonded to the connector bad 23b' as shown in FIGS. 5A and 5B, so that connection of the solder ball 16 to the connector pad 23b' is completed. Thus, the discrete line 15 is formed to extend along the passages 25a, 25b and 26 and is wired without covering other connector pads.

A case in which a new discrete line is wired at a position where the discrete line has already been wired will next be described with reference to FIGS. 7A through 7F.

Figure 7A:
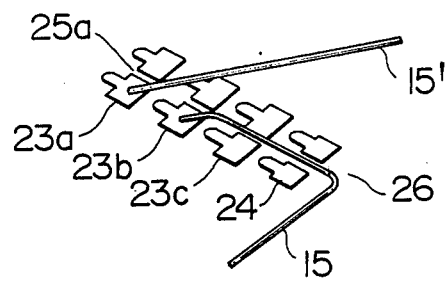
FIGS. 7A through 7F are diagrammatic views for explanation of the wiring method according to the present invention, in which a plurality of discrete lines are wired in a superimposed manner.
Figure 7B:
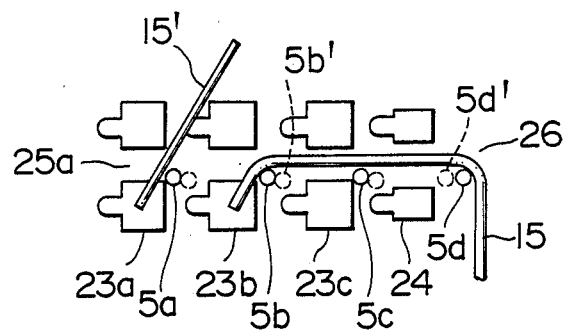
Figure 7C:
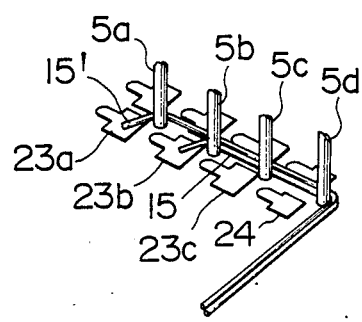
Figure 7D:
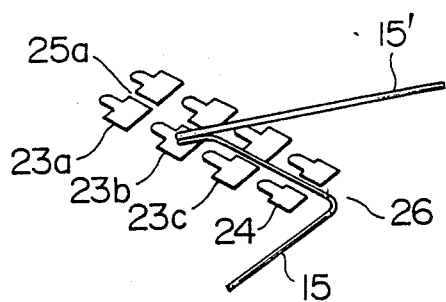
Figure 7E:
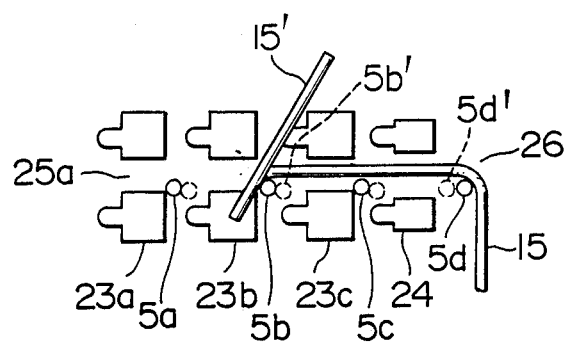
Figure 7F:
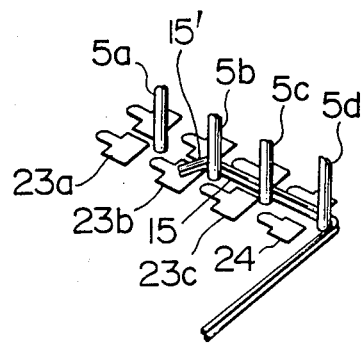
Figure 8:
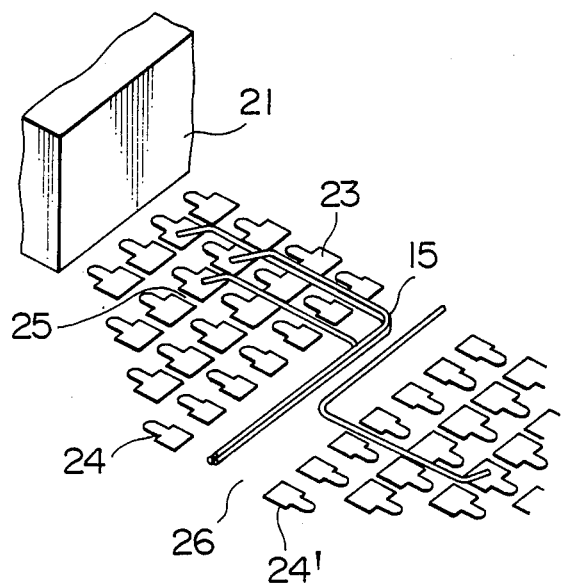
FIG. 8 is a diagrammatic perspective view of the discrete lines wired on the basis of the wiring method according to the invention.

A new discrete line 15' is connected to the connector pad 23a and extended on the passage 25a which extends along the connector pads 23a (FIG. 7A). As indicated by the broken lines in FIG. 7B, the wiring apparatus 1 in which the first and second pin holders 3 and 4 are in the closed position is positioned inside the already-wired discrete line 15. Subsequently, the first and second pin holders 3 and 4 are angularly moved to the open position so that the pins are located along the already-wired discrete line 15, as indicated by the solid lines in FIG. 7B. The new discrete line 15' is bent and deformed along the pins 5a and 5d and is superimposed upon the already-wired discrete line 15 (FIG. 7C). At this time, the number of the pins of the wiring apparatus 1 is made equal to the sum of the connector pads 23 and 24 along the passage 25a, and the spacings between adjacent pins is made equal to those between adjacent connector pads. Accordingly, when the new discrete line 15' is superimposed upon the already-wired discrete line 15, the pins 5b and 5c serve as reinforcement of the already-wired discrete line 15. As a result, it is possible to prevent the form of the already-wired discrete line 15 from being deformed at the superimposing. Subsequently, the rod 13 of the hydraulic cylinder 12 is moved rearwardly to angularly move the first and second pin holders 3 and 4 to the closed position indicated by the solid lines in FIG. 6D, thereby reducing the distance between the pins. The wiring apparatus 1 is then moved away from the passage 25a. Thus, the new discrete line 15' is wired along the passage 25a in such a manner as to be superimposed upon the already-wired discrete line 15 (FIG. 8).

Figure 5C:
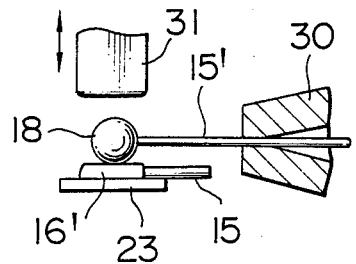

The above embodiment has been described on the basis of an example in which the new discrete line 15' is connected to another connector pad 23a arranged along the same passage 25a. In case where the new discrete line 15' is connected to the same connector pad 23b (FIGS. 7D-7F), as shown in FIG. 5C, a solder ball 18 of the new discrete line 15' is superimposed upon the solder ball 16' pressure-bonded to the surface of the connector pad 23b, and is heated and pressure-bonded to the solder ball 16'. Thus, it is possible to connect the plurality of discrete lines 15 to the connector pad 23 without the necessity of increasing the area of the connector pad 23.

Further, the superimposed discrete lines 15 and 15' may be adhesively bonded to each other. By doing so, it is ensured to maintain the superimposition of the discrete lines 15 and 15' upon each other.

Moreover, in the above embodiment, the pins of the wiring apparatus 1 are made equal in number to the sum of the connector pads 23 and 24 along the passages 25. However, the number of the pins may be only two, though there is a concern that the already-wired discrete lines slightly get out of shape. In this case, the positioning pins 8a and 8b of the wiring apparatus 1 are adjusted to bring the spacing between the two pins at the open position into coincidence with the spacing between the connector pads to be connected. For instance, in FIG. 7C, when the connector pad to be connected is the connector pad 23a, the spacing between the two pins at the open position is brought to the distance between the pins 5a and 5d, while when the connector pad to be connected is the connector pad 23b, the spacing between the two pins at the open position is brought to the distance between the pins 5b and 5d.

As described above, according to the invention, there are provided the discrete-line wiring method and apparatus suitable for an electronic device having mounted thereto electronic components at high density, in which a plurality of discrete lines can be connected to the same connector element without the necessity of increasing an area of the connector element and an area of the passage for permitting the discrete lines to pass and without interference with connection of another discrete line to another connector element.

What is claimed is:

1. A method for wiring an electronic device including a plurality of electronic components and a plurality of connector elements interconnecting the plurality of electronic components, said connector elements being arranged on the same plane in spaced relation to each other so as to define passages between said connector elements, comprising the steps of:

connecting a first discrete line to a surface of a first connector element;

providing a tool comprising a pair of pin holders with at least two pins supported for angular movement toward and away from each other;

positioning at least two of said pins along a first passage substantially normal thereto;

extending said first discrete line on said first passage defined by said first connector element and a second connector element by bending and deforming said first discrete line along said pins; and reducing a distance between said pins, and removing said pins away from said first passage.

2. A method according to claim 1, further comprising the steps of:

connecting a second discrete line to a surface of a third connector element located along said first passage:

positioning said at least two pins along said first discrete line substantially vertical to said first passage;

bending and deforming said second discrete line along said pins positioned along said first discrete line, to superimpose said second discrete line upon said first discrete line; and reducing the distance between said pins positioned along said first discrete line, and removing said pins away from said first passage, thereby wiring said third discrete line to said second connector element.

3. A method according to claim 1, further comprising the steps of:
- connecting a second discrete line to the surface of said first connector element and being superimposed upon said first discrete line;
- positioning said at least two pins along said first discrete line substantially perpendicularly to said first passage;
- bending and deforming said second discrete line along said pins positioned along said first discrete line, to superimpose said second discrete line upon said first discrete line; and
- reducing the distance between said pins positioned along said first discrete line, and removing said pins away from said first passage, thereby wiring said second discrete line to said first connector element.

4. A method according to claim 2, further comprising the step of adhesively bonding the superimposed first and second discrete lines to each other.

5. A method according to claim 3, further comprising the step of adhesively bonding the superimposed first and second discrete lines to each other.

6. A method for wiring an electronic device including a plurality of electronic components and a plurality of connector elements for interconnecting the plurality of electronic components, said connector elements being arranged on the same plane in spaced relation to each other so as to define passages between said connector elements, comprising the steps of:
- connecting a first discrete line to a surface of a first connector element;
- providing a tool comprising a pair of pin holders with at least two pins supported for angular movement toward and away from each other;
- positioning at least two of said pins along a first passage substantially normal thereto;
- extending said first discrete line on said first passage defined by said first connector element and a second connector element, by bending and deforming said first discrete line along said pins;
- reducing a distance between said pins, and removing said pins away from said first passage;
- positioning said at least two pins along a second passage, defined by said second connector element and a third second connector element, said at least two pins being positioned substantially normal to said passage;
- extending said first discrete line on said second passage by bending and deforming said first discrete line along said pins;
- reducing the distance between said pins and removing said pins away from said second passages; and
- connecting said first discrete line to a surface of said third connector element.

7. A method according to claim 6, further comprising the steps of:
- connecting a second discrete line to a surface of a fourth connector element located along said first passage;
- positioning said at least two pins along said first discrete line substantially normal to said first passage;
- extending said second discrete line by bending and deforming said second discrete line along said pins positioned along said first discrete line, to superimpose said second discrete line upon said first discrete line; and
- reducing the distance between said pins positioned along said first discrete line, and removing said pins away from said first passage, thereby wiring said second discrete line to said fourth connector element.

8. A method according to claim 6, further comprising the steps of:
- connecting a second discrete line to the surface of said first connector element with said second discrete line superimposed upon said first discrete line;
- positioning said at least two pins along said first discrete line substantially perpendicular to said first passage;
- extending said second discrete line by bending and deforming said second discrete line along said pins positioned along said first discrete line, to superimpose said second discrete line upon said first discrete line; and
- reducing the distance between said pins positioned along said first discrete line, and removing said pins away from said first passage, thereby wiring said second discrete line to said first connector element.

9. A method according to claim 7, further comprising the step of adhesively bonding the superimposed first and second discrete lines to each other.

10. A method according to claim 8, further comprising the step of adhesively bonding the superimposed first and second discrete lines to each other.

* * * * *

UNITED STATES PATENT AND TRADEMARK OFFICE
CERTIFICATE OF CORRECTION

PATENT NO. : 4,934,044

DATED : 19 June 1990

INVENTOR(S) : Hiroshi HASEGAWA et al.

It is certified that error appears in the above-identified patent and that said Letters Patent is hereby corrected as shown below:

| Column | Line | Corrections |
| --- | --- | --- |
| ABS. | 15 | Change "Similar," to --Similarly,--. |
| ABS. | 16 | Change "line" to --lines--. |
| 3 | 25 | Change "PREFERRED EMBODIMENTS" to --PRESENT INVENTION--. |
| 5 | 15 | Change "bad" to --pad--. |
| 5 | 41 | Change "is" to --are--. |
| 6 | 57 | After "passage" change ":" to --;--. |
| 6 | 59 | Change "vertical" to --normal--. |
| 7 | 4-5 | Delete "being superimposed" and insert --superimposing it--. |
| 7 | 46 | Delete "second". |

Signed and Sealed this

Twenty-second Day of October, 1991

*Attest:*

HARRY F. MANBECK, JR.

*Attesting Officer*  *Commissioner of Patents and Trademarks*